United States Patent [19]

Poelzing

[11] Patent Number: 4,927,590
[45] Date of Patent: May 22, 1990

[54] METHOD FOR ENCAPSULATING INTEGRATED CIRCUITS

[75] Inventor: Gerhard W. Poelzing, New Providence, N.J.

[73] Assignee: At&T Bell Laboratories, Murray Hill, N.J.

[21] Appl. No.: 358,313

[22] Filed: May 26, 1989

[51] Int. Cl.[5] .................. B29C 45/02; B29C 45/14
[52] U.S. Cl. .................. 264/272.17; 264/328.5; 264/328.17; 425/812
[58] Field of Search ........... 264/272.17, 328.5, 328.17; 425/812

[56] References Cited

U.S. PATENT DOCUMENTS 4,569,814  2/1986  Chong et al. .............. 264/272.17
4,653,993  3/1987  Boschman .................. 264/272.17

FOREIGN PATENT DOCUMENTS 143656  12/1978  Japan .................... 264/272.17

Primary Examiner—James Lowe
Attorney, Agent, or Firm—Peter V. D. Wilde

[57] ABSTRACT

In molding integrated circuit packages voids are found in the molded plastic due to air entrapped in the charging container. It was discovered that entrapped air can be avoided if a portion of the preheated charge material has a higher viscosity than the remainder. Conveniently, this is achieved by preheating the preforms in a temperature gradient and charging the hottest preforms last into the container. The pressure causes the material at the top of the chamber to flow first, thereby expelling unwanted air through the runners ahead of the plastic flow. An effective implementation results from tilting the RF electrode in the preheating apparatus.

8 Claims, 3 Drawing Sheets

METHOD FOR ENCAPSULATING INTEGRATED CIRCUITS

BACKGROUND OF THE INVENTION

Yield losses in semiconductor integrated circuit manufacture occur at various stages in the manufacturing process. Those that occur during packaging, the final operation, are especially expensive because of the substantial investment already made in the device at that stage of its manufacture. A troublesome defect in plastic packaging are voids in the molded part. Not only are voids unacceptable from the standpoint of the integrity of the package, but the entrained gas that causes the void often produces a hydrostatic pressure shock sufficient to destroy one or more wire bonds between the chip and the lead frame.

In conventional molding of plastic packages the thermosetting resin is preheated prior to introduction into the molding apparatus. The resin is preheated in the for of large pellets or tablets. The preheated tablets are placed in a cylinder, or transfer pot, and a piston is used to produce the hydrostatic pressure necessary to transfer the molding resin through the distribution channels, or runners, to the individual mold cavities. As a result of substantial experience in observing this operation, and studying the formation of unacceptable voids, I reached the conclusion that voids formed in the plastic package occur as the result of air entrapped in the transfer resin while it is in the transfer pot. I have also concluded that air will unavoidably be trapped in the charge if the charge is preheated according to the standard practice in the art.

SUMMARY OF THE INVENTION

My invention involves a non-homogeneous viscosity charging method. A non-homogeneous charging method in the context of the invention means that the charge is not homogeneous in viscosity but contains material with at least two different viscosities. That result can be obtained in a variety of ways that are intended to be within the scope of the invention. Different resins can be used, and preheated to the same, or different, temperatures to achieve at least two viscosity values. My preferred technique involves preheating a first body of the molding material to one temperature and another body of molding material to a higher temperature. Another preferred technique is to preheat the charging material in a temperature gradient so that the temperature of the charge varies from one portion of the charge to another. I have also found that voids are most dependably avoided when the low viscosity material is placed in the portion of the charge pot or cylinder that is located farthest from the air escape route. In conventional molding equipment this means that the tablets with the lowest viscosity are charged last into the pot.

Other important advantages are found to result from the use of this technique. For example, if premature curing of the thermosetting resin in the charge pot occurs, it typically occurs at the bottom of the pot where heat from the hot mold zones heats the bottom of the pot. If the charging material at the bottom of the pot is relatively cool, as taught here, it is less susceptible to premature crosslinking.

These and other features of the invention will be more easily understood from the following detailed description.

DETAILED DESCRIPTION

The invention will be described in the context of a conventional and widely used molding apparatus. The essential aspects of the charging technique are not dependent on the specific nature of the equipment used, as will be appreciated by those versed in plastic molding techniques. The technique however been developed to suit equipment similar to that of FIG. 1, and for a process in which the uncured epoxy resin used in the molding operation is loaded into the transfer pot in the form of large pellets, and typically pellets with a tablet shape.

Figure 1:
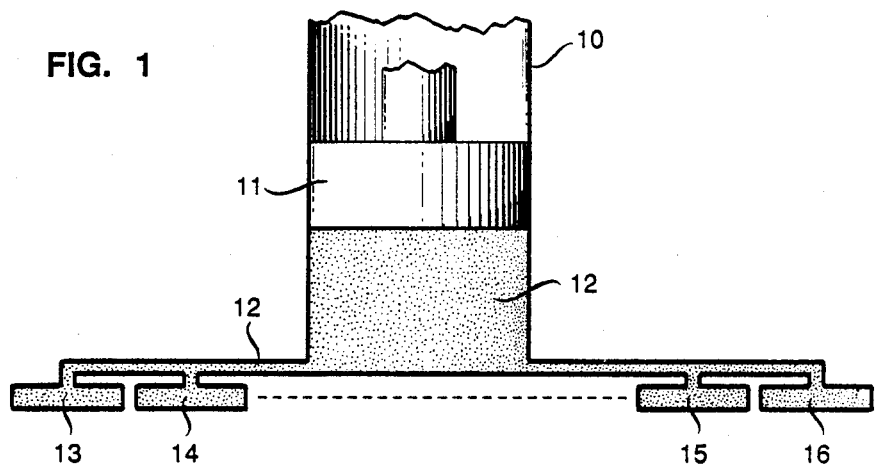
FIG. 1 is a schematic view of a typical plastic IC packaging apparatus.

The apparatus of FIG. 1 consists generally of a transfer pot 10, and piston 11 fitting closely within the pot as shown. At the base of the pot are passageways or runners 12 leading to the individual molding cavities 13. The plastic molding material is denoted 14. Four cavities are shown but a typical apparatus may have tens or hundreds.

Figure 2:
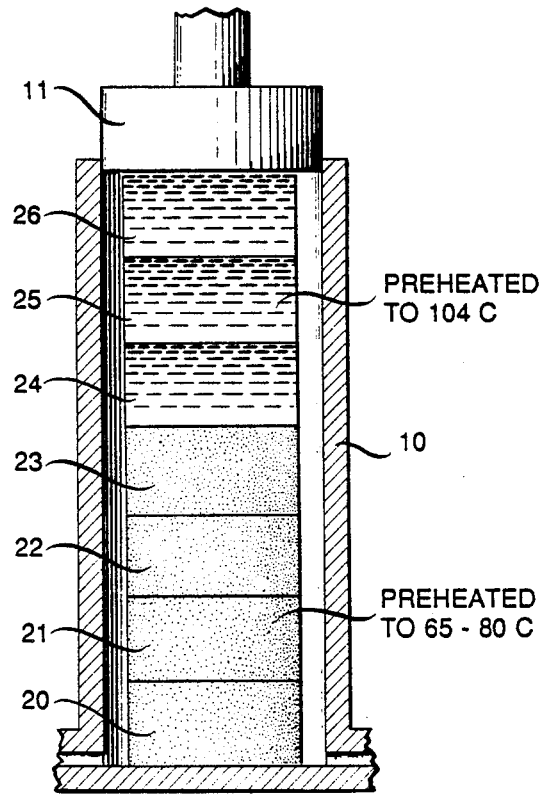
FIGS. 2–4 are schematic views of the charge pot at various stages of the molding operation showing the non-homogeneous viscosity charging technique.
Figure 3:
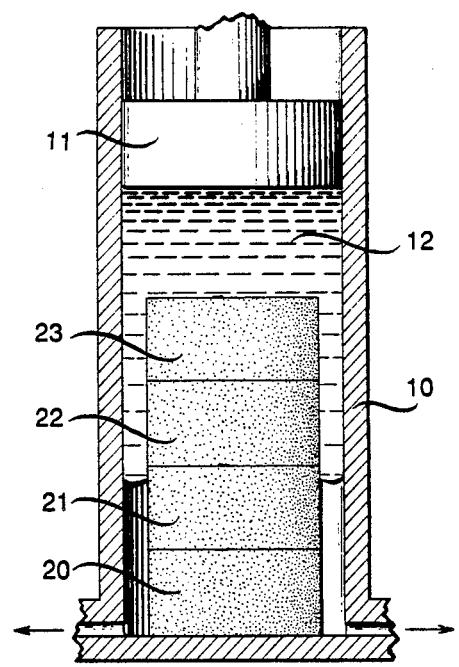
Figure 4:
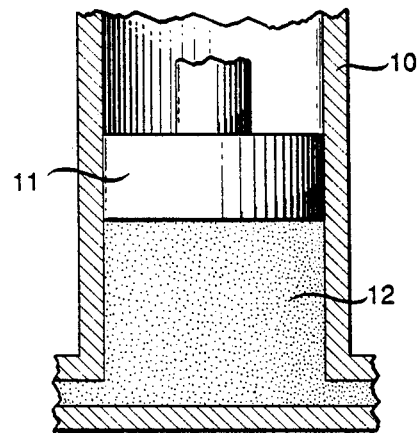

FIGS. 2–4 show the transfer pot 10 during the early stages of the molding operation. By way of example, seven preforms or tablets 20–26 are shown charged into pot 10. It is evident that, with piston 11 in position to create hydrostatic molding pressure, the only vent for escape of air from the pot is via passageways 12. According to one embodiment of the invention, tablets 20–23 are preheated prior to being placed in the ot, to a first temperature, and tablets 24–26 are preheated to a second temperature higher than the first temperature. Since the tablets in this embodiment are of the same material, the resin in tablets 24–26 has a viscosity lower than the resin in tablets 20–23. Both temperatures are typically within the softening range of the resin so that the tablets maintain at least some of the tablet shape. This aids in handling of the preforms and charging them into the pot 10. It is a further feature of the invention that the material with the highest viscosity, i.e. tablets 20–23, be placed nearest the air outlets of the pressure chamber.

As pressure is applied via the piston 12, the resin material begins to flow as shown schematically in FIG. 3. The less viscous material from tablets 24–26 flows first and surrounds the tablets 20–23, driving air from between and around those tablets and expelling the air from the pressure chamber through the passageways 12 as shown.

Finally, as the resin from all the tablets melts it is expelled from the chamber to the mold sites 13 as shown in FIG. 4.

Alternatively, as earlier indicated, tablets 24–26 may consist of a material with a softening temperature below that of tablets 20–23 producing the equivalent effect of avoiding entrained pockets of air in the transfer pot through the use of material with different viscosity values.

Figure 5:
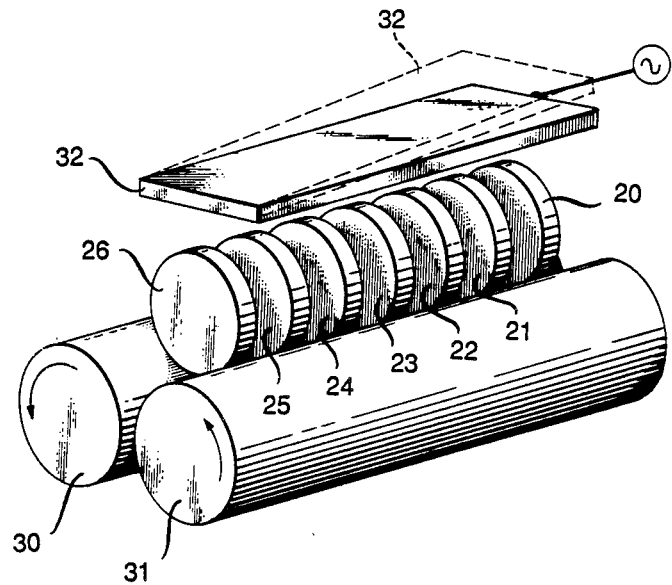
FIG. 5 is a schematic perspective of apparatus useful for preheating the charge according to one aspect of the invention.

In a further preferred embodiment the tablets 20-26 have a range of effective viscosities decreasing monotomically in value from tablet 20 to tablet 26. Achieving this from compositional variation is less convenient than by varying the preheat temperature. A technique for producing preheat temperatures over a range of values is described in connection with FIG. 5, which shows a conventional RF preheating apparatus used in the industry for preheating preforms in the manufacture of integrated circuits. The apparatus consists, in its main parts, of two rollers 30, 31 and an RF electrode 32. The preforms 20-26 are situated on the rollers as shown. In the arrangement of FIG. 5, a common arrangement used in the industry, each preform is heated to approximately the same temperature. According to my modification, the RF electrode is positioned as shown in FIG. 5, i.e., with a tilt of e.g. 7°. With a varying distance between the RF source and the preforms 20-26, preform 20 reaches a higher preheat temperature than preform 21, and so on.

The invention may be practiced with standard materials and processing conditions with the exception that at least some of the molding resin in a single batch of molding material charged into the pressure chamber varies in viscosity by more than 5% and in some cases more than 10% as compared with the remainder of the molding material. When molding material of uniform composition is used to practice the invention, at least some of the charge is preheated to a temperature of more than 5 degrees centigrade and in some cases more than 10 degrees centigrade greater than another portion of the charge.

An exemplary procedure consists of stacking 3 preforms heated to the high temperature of 104° C. on top of 4 preforms heated to a lower temperature of approximately 72° C. The actual temperature read-out for either temperature will vary with the equipment used. In general, the low temperature material should have a stiff, yet deformable, consistency to it, whereas the hotter material should be just at the temperature where it will deform on the rollers 30, 31 of the preheater.

This stack of 7 preforms is approximately the same height as the transfer 10 so that the plunger contacts the charge just as it enters and seals the cylindrical cavity. The preforms were 40 mm in diameter compared to a transfer pot diameter of 64 mm (2.5 inch) providing a considerable air gap around the charge. This configuration is illustrated in FIG. 2.

The upper preforms heated to 104° C. readily deform and flow once contacted by the moving plunger. The lower 4 preforms, however, are stiff and rigid since they have been heated to a significantly lower temperature; they therefore resist deformation. The hotter material is forced to flow over the rigid column of the lower preforms, and in the process pushes out the air in the gap between the rigid column and the transfer pot as shown in FIGS. 3 and 4. This air is pushed out ahead of, as opposed to with, the molding compound, so that is little if any air entrained in the charge. Photographic studies of molding material sections confirm that this preheat technique has essentially eliminated trapped air in the transfer pot that could enter the runners.

Initial molding trials were conducted on the plate mold with actual product using this novel preheat method. All of the packages were then analyzed with X-Ray photography. Only 3 small voids were found in 720 molded packages. This occurrence (0.4%) is approximately 5-10 times less than what was previously encountered in both plate and cavity molds. Subsequent trials with thousands of 1 Mbit devices and production operators have confirmed that the occurrence of voids is consistently below 0.2% with this preheating technique.

The following additional examples demonstrate further processing conditions useful with the invention:

| MOLDING PARAMETERS SETTING MOLD COMPOUND: SUMIKON 6300 HD | |
|---|---|
| PACKAGE TYPE: | 44L PLCC |
| MOLD PRESS: | FUJIWA/J. D. SPROUT |
| PLUNGER DIA.: | 2.5" |
| MOLD PLATEN TEMP.: | 165-171 C. |
| ACT. TRANSFER PRESSURE: | 900-1000 PSI |
| CLAMPING PRESSURE: | 2000-2300 PSI |
| TRANSFER TIME: | 16-18 SECS |
| TRANSFER SLOW DOWN DISTANCE: | 105 mm-110 mm |
| CURE TIME: | 230 SECS |
| PELLET PREHEAT TEMP | |
| HARD PELLET: | 72-76 C. |
| SOFT PELLET: | 88-94 C. |
| (TEMP DIFFERENCE): | 12-18 C. |
| NO. OF PELLETS: | 4 (120 GRAMS) |
| APERTURE PLATE PREHEAT TEMP: | 150° C. |
| APERTURE PLATE PREHEAT TIME: | 8 MIN. |
| MOLDING PARAMETERS SETTING MOLD COMPOUND: EME 6300 HD (SPIRAL FLOW LENGTH 92 TO 105 CM) | |
| PACKAGE TYPE: | 84L PLCC |
| MOLD PRESS: | FUJIWA/J. D. SPROUT |
| PLUNGER DIA.: | 2.5" |
| MOLD PLATEN TEMP.: | 165-171 C. |
| ACT. TRANSFER PRESSURE: | 880-950 PSI |
| CLAMPING PRESSURE: | 2000-2200 PSI |
| TRANSFER TIME: | 16≠20 SECS |
| TRANSFER SLOW DOWN DISTANCE: | 132 mm-137 mm |
| CURE TIME: | 230 SECS. |
| PELLET PREHEAT TEMP | |
| HARD PELLET: | 78-84 C. |
| SOFT PELLET: | 86-93 C. |
| (TEMP DIFFERENCE): | 5-10 C. |
| NO. OF PELLETS: | 5 (120 GRAMS) |
| APERTURE PLATE PREHEAT TEMP: | 175° C. |
| APERTURE PLATE PREHEAT TIME: | 12 MIN. |

Best results are obtained when the colder preforms are loaded at the bottom of the pot. When the stacking was intentionally reversed that is the cold preforms were placed at the top of the stack, large amounts of air were trapped and entrained in the material. In the reversed case, the soft, high temperature preforms flow first into the runners, trapping the air in the pot.

Various additional modifications and deviations from the invention as here set forth may be made by those skilled in the art without departing from the spirit and scope of the invention defined in these appended claims.

I claim:

1. A process for molding a plastic packaging around an integrated circuit device by placing the device in a mold cavity and injecting uncured molding material into the cavity under pressure the steps of: introducing a charge of preheated molding material into a pressure chamber and applying pressure to the pressure chamber to inject the molding material into the mold cavity the process characterized in that the preheated molding material, when introduced into said pressure chamber, comprises a first body of molding material having a first viscosity and a second body of molding material having a second viscosity more than 5% different from the first viscosity.

2. A process for molding a plastic package around an integrated circuit device by placing the device in a mold cavity and injecting uncured molding material into the cavity under pressure the steps of: preheating a plurality of resin preforms, said preforms having a tablet shape, stacking the plurality of preheated preforms into a cylindrical stack, placing the stacked preheated preforms into a cylindrical pressure chamber, said chamber having a diameter larger than the diameter of the stack, and having at least one passageway extending from the chamber to the mold cavity, and applying pressure to the stack of preforms to force the molding material through the passageway to the mold cavity the process characterized in that at least one preform is preheated to a temperature more than 10 degrees C. higher than the temperature of another.

3. The process of claim 1 in which the said at least one preform is positioned on the end of the stack farthest from said passageway.

4. The process of claim 3 in which the passageway is located at the bottom of the pressure chamber and the at least one preform is the uppermost preform of the stack of preforms.

5. The process of claim 4 in which the said temperature is more than 20 degrees C. higher than another.

6. The process of claim 2 in which each preform of the stack is preheated to a different temperature with the preheat temperatures ascending from one end of the stack to the other.

7. The process of claim 6 in which the passageway is located closest to the preform with the lowest preheat temperature.

8. The process of claim 7 in which the tablet with the lowest preheat temperature maintains approximately its tablet shape while the tablet with the highest preheat temperature is essentially molten.

* * * * *